United States Patent [19]

Henderson et al.

[11] Patent Number: 5,034,679
[45] Date of Patent: Jul. 23, 1991

[54] POLARIZATION FEEDBACK CONTROL OF POLARIZATION ROTATING SENSOR

[75] Inventors: Eric A. Henderson; Terrill G. Power; Stephen R. Jones, all of Rockford, Ill.

[73] Assignee: Sundstrand Corporation, Rockford, Ill.

[21] Appl. No.: 450,530

[22] Filed: Dec. 14, 1989

[51] Int. Cl.⁵ .......................................... G01R 33/032
[52] U.S. Cl. .................................. 324/96; 324/117 R; 324/244
[58] Field of Search ...................... 324/96, 117 R, 244; 350/375, 376

[56] References Cited

U.S. PATENT DOCUMENTS 3,466,541  9/1969  Bernard et al. ........................ 324/96
4,542,338  9/1985  Arditty et al. ........................ 324/96

Primary Examiner—Ernest F. Karlsen
Attorney, Agent, or Firm—Antonelli, Terry, Stout & Kraus

[57] ABSTRACT

A measuring system (40) for measuring a magnitude of a quantity in accordance with the invention includes a light source (52) for providing a light beam (58); a polarization controller (44), optically coupled to the light beam, for rotating a plane of polarization of the light beam through an angle in response to a control signal, which is proportional to the magnitude of the quantity being measured to provide a first rotated polarized beam of light; a sensor (46), coupled optically to the first rotated polarized beam of light and to the quantity being measured, which rotates the plane of polarization of the first rotated polarized beam through an angle proportional to the quantity being measured to provide a second rotated polarized beam of light; an analyzer (42), coupled optically to the second rotated polarized beam of light, having a constant plane of polarization for detecting the second rotated polarized beam of light produced by the quantity being measured; and a feedback and output circuit, coupled to an output of the analyzer, for providing an output proportional to magnitude of the quantity being measured and producing the control signal.

20 Claims, 4 Drawing Sheets

POLARIZATION FEEDBACK CONTROL OF POLARIZATION ROTATING SENSOR

TECHNICAL FIELD

The present invention relates to sensors which utilize rotation of the plane of polarization of a light beam interacting with a quantity being measured.

BACKGROUND ART

FIG. 1 illustrates a block diagram of a magneto-optical-current sensor disclosed in patent application Ser. No. 212,579, filed June 28, 1988, now U.S. Pat. No. 4,947,107, which is assigned to the Assignee of the present invention. The system disclosed in the aforementioned application has a light source 10 which produces a beam of light 12 which is imaged upon a plane polarizer 14 which polarizes the beam of light into a first plane of polarization. The output beam of light 16 from the plane polarizer 14 is imaged upon an optical sensor 18 which exhibits the Faraday effect. The optical sensor 18 functions to rotate the plane of polarization of the incident beam 16 by an amount proportional to a magnitude of current flowing in a electrical conductor (not illustrated) which produces a magnetic field coupled to the optical sensor 18. The output beam 20 has a plane of polarization which is rotated by an angle which is directly proportional to the magnitude of the current flowing in the conductor. The light beam 20 is coupled to an analyzer 22 which includes an analyzing polarizing beam splitter (not illustrated) which divides the incident light of beam 20 into first and second beams 24. The plane of polarization of the polarizing beam splitter within the analyzer 22 is rotated 45° with respect to the plane of polarization of the plane polarizer 14. In the absence of current flow in the conductor, the magneto-optic current sensor 18 does not cause any rotation of the incident beam 16 which results in components being outputted of equal magnitude from the analyzer in the aforementioned first and second beams 24. The first and second beams 24 of the analyzer are applied to a nulling and output circuit 26 which photodetects the light beams and arithmetically processes the resultant signals to produce an output 28 which is proportional to the magnitude of the current flowing in the conductor. The nulling and output circuit feeds back a signal which drives a coil (not illustrated) wrapped around a magneto-optic current sensor 18. The flow of current through the coil produces a magnetic field which opposes and cancels the magnetic field produced by the current flow in the conductor. As a result, the rotation of the plane of polarization of the beam 20 is nulled to the plane of polarization of the incident light beam 16. The aforementioned system has disadvantages in applications such as airframes where it is desirable to measure current flow in remote parts of the airframe. Application of the system of FIG. 1 to an airframe for measuring current requires an electrical conductor 30 extending from the nulling and output circuit 26 directly to the point of sensing around the current sensor 18. The electrical wire 30 is susceptible to electromagnetic interference especially where a long length of wire is required to run from the nulling and output circuit 26 to the location of the magneto-optic current sensor 18.

Furthermore, other systems are known which utilize nulling to measure current flow magneto-optically. See U.S. Pat. Nos. 3,419,802, 3,502,978, 3,581,202, 4,516,073 and 4,370,612.

U.S. Pat. No. 4,539,519 discloses a magneto-optic current measuring system which feeds back a signal for nulling the effects of birefringence in an optical fiber conducting light which is magnetically coupled to the magnetic field produced by a current being measured. The current measuring system of the '519 patent does not utilize nulled detection for measuring the magnitude of the current.

DISCLOSURE OF INVENTION

The present invention provides a measuring system utilizing null detection which does not require the application of a nulling signal directly to the sensor. The invention is applicable to measuring systems utilizing the magneto-optic effect (Faraday effect); electro-optic effect (Kerr effect); and photoelastic effect, in which the plane of polarization rotates in direct proportion to pressure applied to the sensor. The measuring systems of the invention may measure current, voltage, magnetic field strength or pressure.

In electrical current measuring applications such as airframes, a lightweight fiber optic cable may be run to and from the point where the current is being sensed while electronics necessary for producing the output signal of the current reading may be positioned in a remote centralized location. Furthermore, the nulling signal is applied directly to a polarization controller to rotate the plane of polarization of the output beam from the polarization controller such that the plane of polarization outputted from the current sensor is nulled to a constant orientation. Consequently, a shorter length of electrical wire may be utilized to feed the nulling signal to the polarization controller which may be shielded to prevent susceptibility to electromagnetic interference and located remote from the current sensor. Finally, a weight savings may be achieved as a consequence of eliminating long lengths of electrical wire between the nulling and output cireuit and the magneto-optic sensor of the prior art.

A measuring system for measuring a magnitude of a quantity in accordance with the invention includes a light source for providing a light beam; a polarization controller, optically coupled to the light beam, for rotating a plane of polarization of the light beam through an angle, in response to a control signal, which is proportional to the magnitude of the quantity being measured to provide a first rotated plane polarized beam of light and coupled to the quantity being measured; a sensor, coupled optically to the first rotated plane polarized beam of light and to the quantity being measured, which rotates the plane of polarization of the polarized beam through an angle proportional to the quantity being measured to provide a second rotated plane polarized beam of light; an analyzer, coupled optically to the second rotated plane polarized beam of light having a constant plane of polarization, for detecting the angle of rotation of the second rotated polarized beam of light produced by the quantity being measured; and a feedback and output circuit, coupled to an output of the analyzer, for providing an output of the magnitude of the quantity being measured and producing the control signal. The feedback and output circuit produces the control signal by calculating a difference between a signal which is proportional to the magnitude of the quantity being measured and a reference signal which is proportional to the magnitude of the light beam prior to application to the sensor. The reference signal may be provided by a driver of the light source or a photodetector optically coupled to an optical coupler optically coupled to the first polarized beam of light. The analyzer polarizes the second rotated polarized beam of light with a fixed polarization to provide a first output light beam; and a first photodetector is optically coupled to the first output beam of light and produces a first signal proportional to an intensity of the first output light beam which is coupled to the feedback and output circuit. The analyzer further polarizes the second rotated polarized beam of light with a fixed polarization to provide a second output signal; and a second photodetector is optically coupled to the second output light beam and produces a second signal proportional to the intensity of the second output light beam which is coupled to the feedback and output circuit. The polarization controller may be a wave guide electro-optic crystal, a fiber squeezer, a fiber coil, a phase plate, a Faraday rotator, a rotatable crank, a Kerr cell or a Pockels cell or any device which rotates a plane of polarization of an incident light beam in direct proportion to an applied control signal. The quantity being measured may be current, voltage, magnetic field strength or pressure.

A method for measuring a magnitude of a quantity in accordance with the invention comprises providing a beam of light from a polarization controller having a plane of polarization rotated through an angle proportional to the magnitude of the quantity being measured; passing the first rotated beam of light through a sensor coupled optically to the first rotated beam of light and coupled to the quantity being measured which rotates the plane of polarization of the first rotated beam of light through an angle proportional to the quantity being measured, and producing an output of the magnitude of the quantity being measured. The rotation of the first rotated beam of light is controlled by comparing a signal proportional to the output signal with a reference signal to provide a difference signal which is applied to the polarization controller having a plane of polarization which varies in proportion to the difference signal. The reference signal may be provided from a photodetector optically coupled to an optical coupler optically coupled to the first rotated beam of light or from a driver for a light source providing a beam of light which is rotated by the polarizer to provide the first rotated beam of light.

BEST MODE FOR CARRYING OUT THE INVENTION

Figure 1:
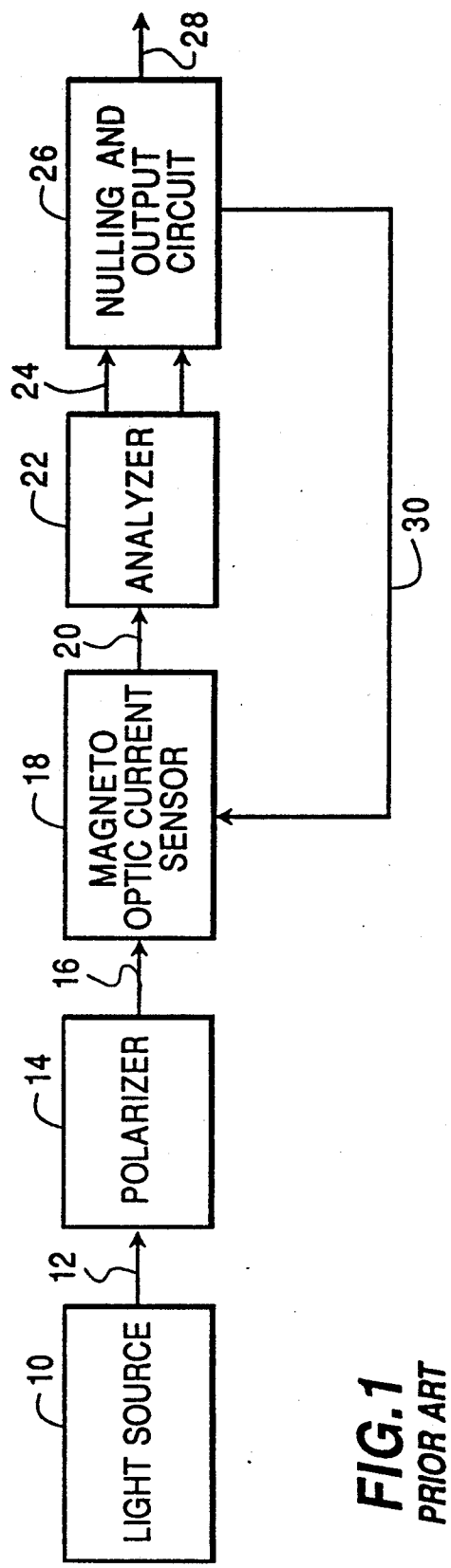
FIG. 1 illustrates a block diagram of a prior art magneto-optic current sensor.
Figure 2:
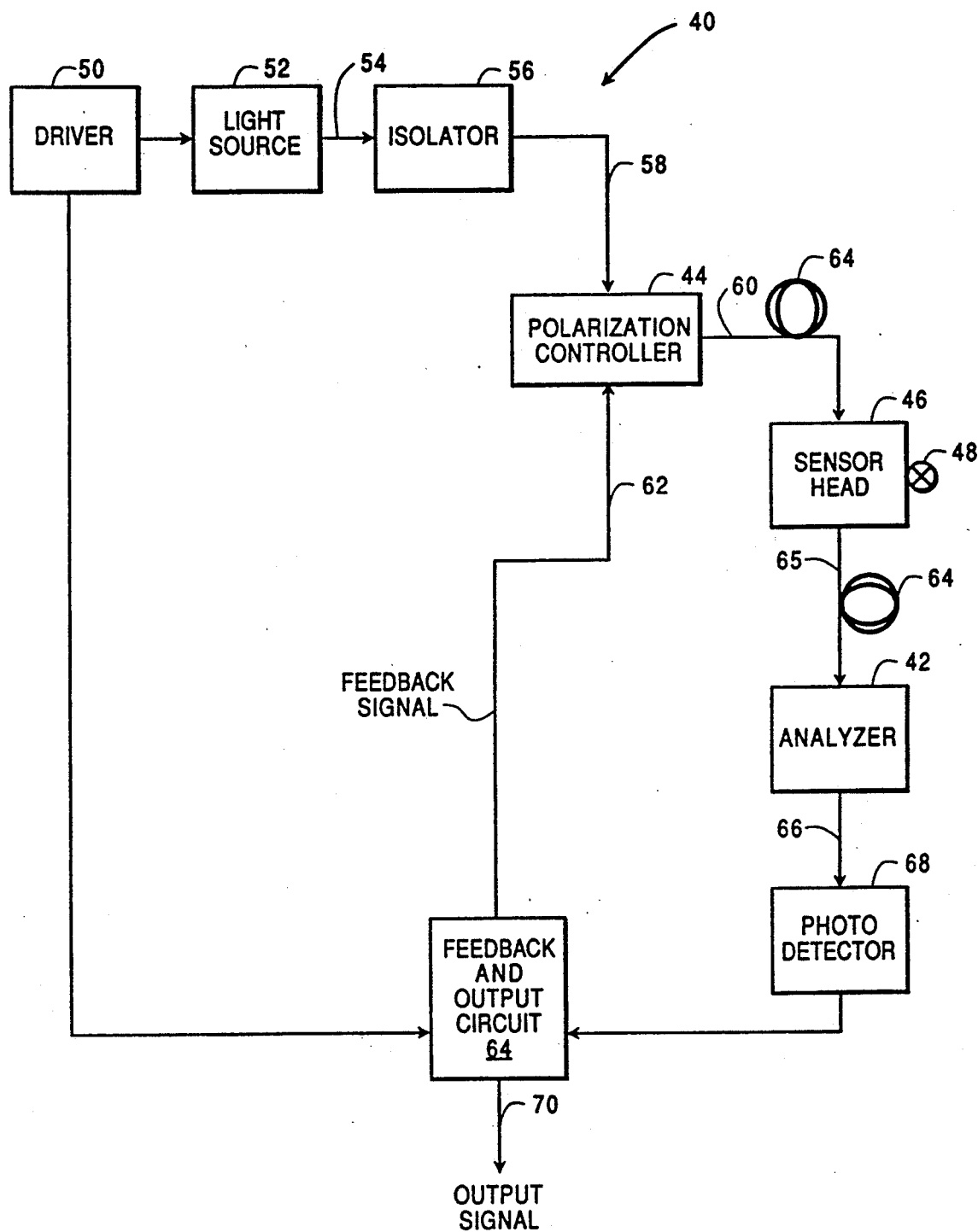
FIG. 2 illustrates a block diagram of a first embodiment of the present invention.

FIG. 2 illustrates a first embodiment 40 of a measuring system in accordance with the present invention. A measuring system in accordance with the present invention functions to produce a nulled plane of polarization at the input of an analyzer 42 by rotating the plane of polarization of light coupled to a polarization controller 44 by an angle which is equal to and opposite to the angular rotation produced by a sensor head 46 which rotates the plane of polarization of light flowing through the head through an angle directly proportional to the magnitude of quantity being measured coupled to the head. The sensor head 46 may be positioned in a position remote from the position of the remainder of the system. The quantity being measured may be current, voltage, magnetic field strength or pressure. The type of sensor head 46 is determined by the quantity being measured. For applications in which current or magnetic field strength is measured, the sensor head 46 utilizes the Faraday effect; for applications in which voltage is measured, the sensor head utilizes the Kerr effect; and for applications in which pressure is measured, the sensor head utilizes the photoelastic effect and may be, for example, made from plastic, glass or quartz. The source 48 of the quantity being measured is positioned to provide the requisite coupling of a field or contact to the sensor head 46. The sensor head 46 may be any known sensor which rotates the plane of polarization of incident light through an angle directly proportional to the quantity being measured to output rotated beam 65. The quantity being measured is coupled to the sensor head 46 by magnetic or electric field coupling or by direct contact. The source 48 of quantity being measured may be a conductor. A driver 50 controls the intensity of a light beam 54 produced by light source 52 so as to produce a constant output intensity. The intensity of the light in the output beam 54 may be regulated by the driver varying either the voltage or current applied to the light source. An optical isolator 56 is utilized if the light source 50 is a laser to prevent undesired reflections back to the light source. Alternatively, the light source may be LED or a laser diode. The light beam 58 is coupled to the polarization controller 44. The polarization controller 44 rotates the plane of polarization of the light beam 58 to produce a rotated output light beam 60 having a plane of polarization rotated in direct proportion to the magnitude of the quantity being measured. The polarization controller 44 is controlled by a feedback signal applied on line 62 from a feedback and output circuit 64 as described below. While not limited thereto, the polarization controller 44 may be a waveguide electro-optic crystal, a fiber squeezer, a fiber coil, a phase plate, a Faraday rotator, a rotatable crank as disclosed in "Polarization-State Control Schemes for Heterodyne or Homodyne Optical Fiber Communications," Journal of Lightwave Technology, Vol. Lt-3, No. 6, Dec. 1965, pp. 1232-1236, by Takanori Okoski, a Kerr cell, a Pockels cell or any device which rotates a plane of polarization of an incident light beam in direct proportion to an applied control signal. Coils of fiber optic cable 64 are contained in the input and output of the sensor head 46 to permit the remote location of the optical sensor head in proximity to the source 48 of the quantity being measured such as a conductor through which current flow is being measured. Preferably, while not limited thereto, the optical fiber may be a single mode fiber which does not introduce rotation of the plane of polarization. Analyzer 42, which may be of any conventional design, causes the output beam 66 to have a plane of polarization rotated 45° with respect to the nominal plane of polarization produced by the polarization controller 44 in the output light beam 60 when no rotation is introduced by either the polarization controller 44 or the sensor head 46. Photodetector 68 converts the light in output 66 from the analyzer into an electrical signal which is proportional to the quantity being measured. Feedback and output circuit 64 functions to produce an output signal 70 which is the magnitude of the quantity being measured from the source 48 and further produces a feedback signal proportional to the magnitude of the output 70 which is applied as the control signal on line 62 to the polarization controller 44. Driver 50 provides a reference signal to the feedback and output circuit 64 which is processed to produce the feedback signal which is equal to the difference between the reference signal and a signal proportional to the output signal 70. The polarization controller 44 introduces rotation of the plane of polarization in the output beam 60 which is equal and opposite to the rotation in the plane of polarization produced by the optical sensor head 46 in the output 65. The plane of polarization applied to the input of the analyzer 42 is nulled to a constant plane of polarization which makes possible nulled detection with the present invention without cancelling the effects of the sensed quantity at the sensor head 46 as in the prior art as described above with respect to FIG. 1.

Figure 3:
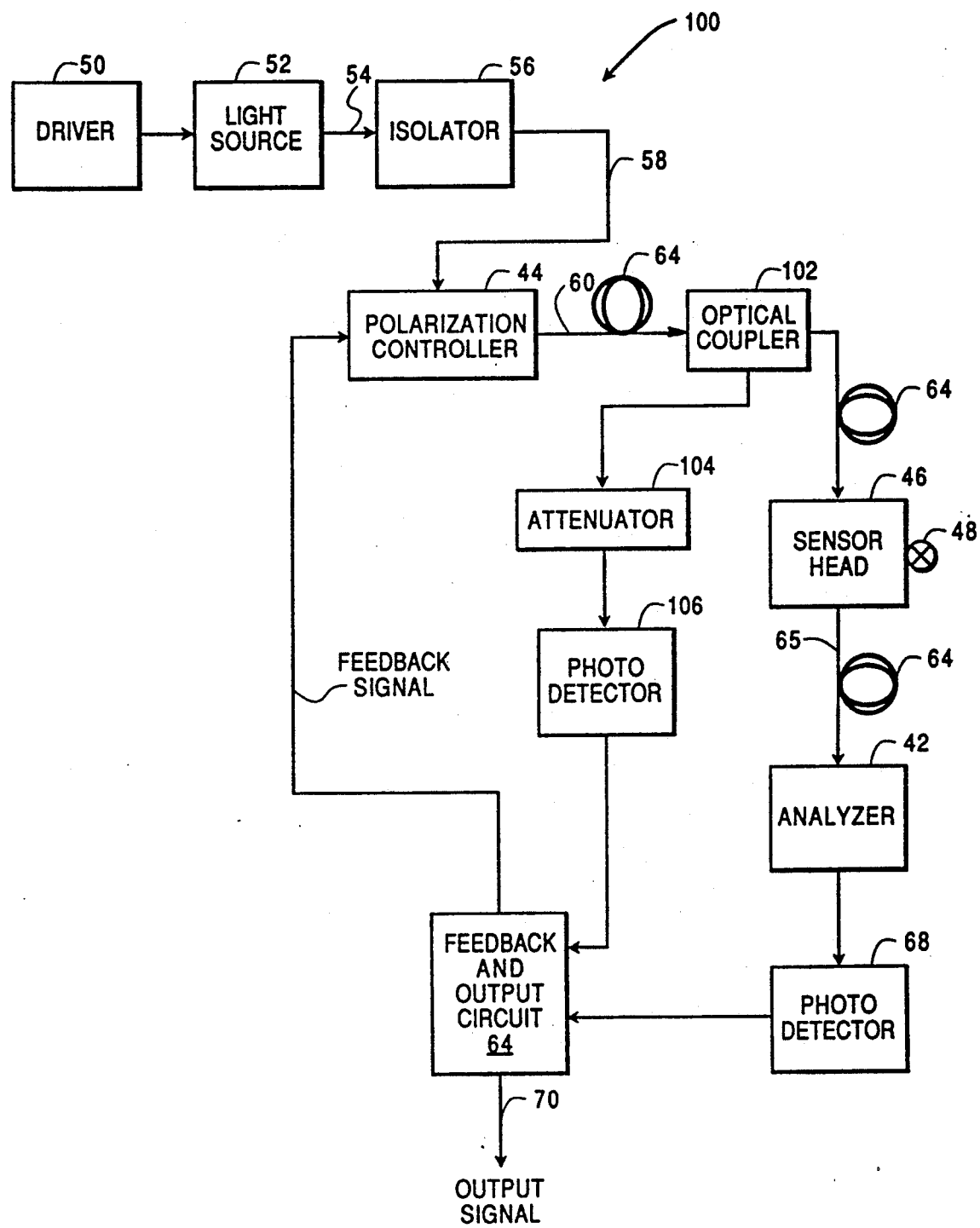
FIG. 3 illustrates a block diagram of a second embodiment of the present invention.

FIG. 3 illustrates a second embodiment 100 of the present invention. Like reference numerals identify like parts in FIGS. 2 and 3. The embodiment 100 of FIG. 3 differs from that of FIG. 2 in that the reference signal applied to the feedback and output circuit 64 is produced by the combination of an optical coupler 102, an attenuator 104 and a photodetector 106. The optical coupler splits the light beam 60 into two light beams one of which is coupled to the sensor head 46 and the other of which is coupled to attenuator 104. The purpose of the attenuator 104 is to lower the intensity of the light outputted by the optical coupler to a point where the photodetector 106 is not saturated. The output of the photodetector 106 is applied to the feedback and output circuit 64 to perform the same function as the output of the driver 50 of FIG. 2.

Figure 4:
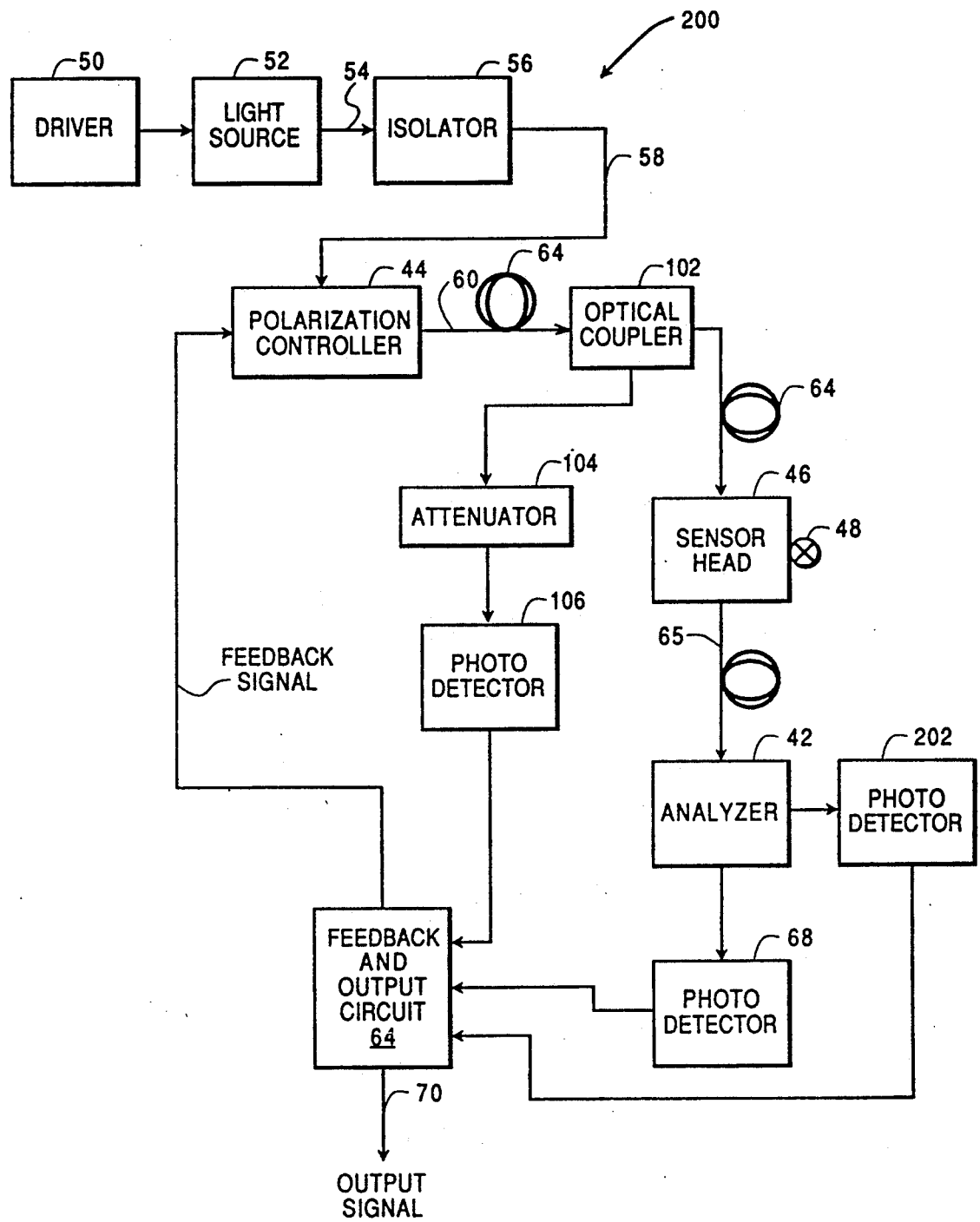
FIG. 4 illustrates a block diagram of a third embodiment of the present invention.

FIG. 4 illustrates a third embodiment 200 of the present invention. Like reference numerals identify like parts in FIGS. 2-4. The embodiment 200 illustrated in FIG. 4 differs from the embodiment 100 illustrated in FIG. 3 in that a second photodetector 202 is used in the detecting of the magnitude of the output signal 70 in a manner which is known in the prior art including the aforementioned patent application.

While the invention has been described in terms of its preferred embodiments, it should be understood that numerous modifications may be made thereto without departing from the spirit and scope of the invention as defined in the appended claims. It is intended that all such modifications fall within the scope of the appended claims.

We claim:

1. A measuring system for measuring a magnitude of a quantity comprising:
   a light source for providing a light beam;
   a polarization controller, optically coupled to the light beam for rotating a plane of polarization of the light beam through an angle, in response to a control signal, which is proportional to the magnitude of the quantity being measured to provide a first rotated plane polarized beam of light;
   a sensor, coupled optically to the first rotated plane polarized beam of light and coupled to the quantity being measured, which rotates the plane of polarization of the first rotated plane polarized beam of light through an angle proportional to the quantity being measured to provide a second rotated plane polarized beam of light;
   an analyzer, coupled optically to the second rotated plane polarized beam of light, having a constant plane of polarization for detecting the second rotated polarized beam of light produced by the quantity; and
   a feedback and output circuit, coupled to an output of the analyzer, for providing an output of the magnitude of the quantity being measured and producing the control signal by calculating a difference between a signal proportional to the quantity being measured and a reference signal that is proportional to the magnitude of the light beam prior to application to the sensor.

2. A measuring system in accordance with claim 1 wherein:
   the reference signal is provided from a driver of the light source.

3. A measuring system in accordance with claim 1 wherein:
   the reference signal is provided from a photodetector optically coupled to an optical coupler optically coupled to the first rotated polarized beam of the light.

4. A measuring system further in accordance with claim 1 wherein:
   the analyzer polarizes the second rotated plane polarized beam of light with a fixed rotation to provide a first output light beam; and
   a first photodetector is optically coupled to the first output light beam and produces a first signal proportional to an intensity of the first output light beam which is coupled to the feedback and output circuit.

5. A measuring system in accordance with claim 4 wherein:
   the analyzer further polarizes the second rotated polarized beam of light with a fixed polarization to provide a second output light beam; and
   a second photodetector is optically coupled to the second output light beam and produces a second signal proportional to an intensity of the second output light beam which is coupled to the feedback and output circuit.

6. A measuring system in accordance with claim 1 wherein:
   the analyzer further polarizes the second rotated polarized beam of light with a fixed polarization to provide a second output light beam; and
   a second photodetector is optically coupled to the second output light beam and produces a second signal proportional to an intensity of the second output light beam which is coupled to the feedback and output circuit.

7. A measuring system in accordance with claim 1 wherein:
   the analyzer further polarizes the second rotated polarized beam of light with a fixed polarization to provide a second output light beam; and
   a second photodetector is optically coupled to the second output light beam and produces a second signal proportional to an intensity of the second output light beam which is coupled to the feedback and output circuit.

8. A measuring system in accordance with claim 3 wherein:
   analyzer polarizes the second rotated polarized beam of light with a fixed rotation to provide a first output light beam; and a first photodetector is optically coupled to the first output light beam and produces a first signal proportional to an intensity of the first output light beam which is coupled to the feedback and output circuit.

9. A measuring system in accordance with claim 1 wherein:
the polarization controller is a waveguide electro-optic crystal.

10. A measuring system in accordance with claim 1 wherein:
the polarization controller is a fiber squeezer.

11. A measuring system in accordance with claim 1 wherein:
the polarization controller is a fiber coil.

12. A measuring system in accordance with claim 1 wherein:
the polarization controller is a phase plate.

13. A measuring system in accordance with claim 1 wherein:
the polarization controller is a Faraday rotator.

14. A measuring system in accordance with claim 1 wherein:
the polarization controller is a rotatable crank.

15. A measuring system in accordance with claim 1 wherein:
the polarization controller is a Kerr cell.

16. A measuring system in accordance with claim 1 wherein:
the polarization controller is a Pockels cell.

17. A measuring system in accordance with claim 1 wherein:
the quantity being measured is current; and
the sensor utilizes the magneto optic effect.

18. A measuring system in accordance with claim 1 wherein:
the quantity being measured is magnetic field strength; and
the sensor utilizes the magneto-optic effect.

19. A measuring system in accordance with claim 1 wherein:
the quantity being measured is voltage; and
the sensor utilizes the electro-optic effect.

20. A measuring system in accordance with claim 1 wherein:
the quantity being measured is pressure; and
the sensor utilizes the photoelastic effect.

* * * * *